United States Patent [19]

Felice et al.

[11] 4,240,844

[45] Dec. 23, 1980

[54] REDUCING THE SWITCHING TIME OF SEMICONDUCTOR DEVICES BY NEUTRON IRRADIATION

[75] Inventors: Patrick E. Felice, Hempfield Township, Westmoreland County; John Bartko, Monroeville; Krishan S. Tarneja; Chang K. Chu, both of Pittsburgh, all of Pa.

[73] Assignee: Westinghouse Electric Corp., Pittsburgh, Pa.

[21] Appl. No.: 972,302

[22] Filed: Dec. 22, 1978

[51] Int. Cl.$^2$ .................. H01L 21/263; H01L 21/26
[52] U.S. Cl. .................... 148/1.5; 148/187; 357/29; 357/91
[58] Field of Search ............... 148/1.5, 187; 357/91, 357/29

[56] References Cited

U.S. PATENT DOCUMENTS

| 3,733,222 | 5/1973 | Schiller | 148/1.5 |
|---|---|---|---|
| 3,769,693 | 11/1973 | Cates et al. | 29/574 |
| 3,809,582 | 5/1974 | Tarnesa et al. | 148/1.5 |
| 3,840,887 | 10/1974 | Roberts et al. | 357/30 |
| 3,852,612 | 12/1974 | Roberts et al. | 250/492 A |
| 3,872,493 | 3/1975 | Roberts et al. | 357/29 |
| 3,877,997 | 4/1975 | Brown | 148/1.5 |
| 3,881,963 | 5/1975 | Chu et al. | 148/1.5 |
| 3,881,964 | 5/1975 | Creswell et al. | 148/1.5 |
| 3,888,701 | 6/1975 | Tarneja et al. | 148/1.5 |
| 3,933,527 | 1/1976 | Tarneja et al. | 148/1.5 |
| 4,056,408 | 11/1977 | Bartko et al. | 148/1.5 |
| 4,076,555 | 2/1978 | Chu et al. | 148/1.5 |
| 4,135,951 | 1/1979 | Stone | 148/1.5 |

OTHER PUBLICATIONS

Srour, "Stable Damage . . . Neutron-Irradiated Si", IEEE Trans. Nucl. Sci., NS-20, 1973, 190.
McKenzie et al., " . . . Neutron . . . Dependence . . . Si Bipolar Transistor", IEEE Trans. Nucl. Science, NS-20, (1973), 341.
Sanga et al., " . . . Neutron Irradiated Transistors", IEEE Trans. Nucl. Sci., NS-20, (1973), 266.
Young et al., " . . . NTD-Si . . . ", J. Appl. Phys. 49 (1978), 4752.
Colwell, " . . . Proton Damage . . . Neutron & Electron . . . " Rad. Effects, 24, (1975) 239.

Primary Examiner—L. Dewayne Rutledge
Assistant Examiner—Upendra Roy
Attorney, Agent, or Firm—C. L. Menzemer

[57] ABSTRACT

The switching time of certain semiconductor devices is decreased while maintaining other electrical characteristics of the devices by irradiating them with a neutron radiation source of greater than 1.0 Mev. to a dosage between $1 \times 10^{11}$ and $1 \times 10^{15}$ neutrons per square centimeter. The irradiation is preferably to a dosage between $1 \times 10^1$ and $1 \times 10^{14}$ neutrons per square centimeter and preferably has substantial energy greater than 14 Mev. The devices are also annealed during and/or subsequent to the irradiation at a temperature higher than the highest specified temperature and preferably at least 50° C. higher than the highest specified temperature.

17 Claims, 9 Drawing Figures

REDUCING THE SWITCHING TIME OF SEMICONDUCTOR DEVICES BY NEUTRON IRRADIATION

BACKGROUND OF THE INVENTION

1. Field of the Invention

The present invention relates to the manufacture of semiconductor devices and particularly fast switching semiconductor devices.

Certain semiconductor devices must be switched from a high current conducting mode to a high voltage blocking mode during their operation. The most common of these is thyristors where the switching time is measured as turn-off time (tq) and diodes where the switching time is measured as reverse recovery time (trr). These semiconductor devices also include transistors, discs, triacs, reverse switching rectifiers and reverse conducting thyristors.

It has recently been demonstrated to irradiate semiconductor devices to modify the electrical characteristics in various ways. See e.g. U.S. Pat. Nos. 3,809,582, 3,840,887, 3,852,612, 3,872,493, 3,877,997, 3,881,963, 3,881,964, 3,888,701 and 3,933,527, and U.S. Pat. applications Ser. Nos. 357,435 (filed May 4, 1973), 540,208 (filed Jan. 10, 1975), 581,255 (filed May 27, 1975) and 667,791 (filed Mar. 17, 1976), all of which have been assigned to the same assignee as the present invention.

More particularly, U.S. Pat. Nos. 3,881,963 and 3,809,582 teach to irradiate high power thyristors and diodes with radiation sources generally and electron radiation sources preferably to decrease the turn-off time and reverse recovery time of such devices. Such irradiation has been demonstrated to produce distinct advantages over gold diffusion previously employed to produce fast switching devices. However, these radiation techniques have been found to have their limitations where other electrical characteristics and particularly forward voltage drop are to be maintained. If a very low turn-off time in a thyristor or a very low reverse recovery time in a diode is desired, a higher forward voltage drop has to be tolerated in the device.

Therefore, simply irradiating thyristors or diodes to reduce the switching time has previously involved a trade-off to a greater or lesser degree with forward voltage drop. The limitation of this trade-off has been reduced to some degree by annealing processes described in U.S. Pat. No. 3,888,701, granted June 10, 1975. However, still some trade-off of switching time with forward voltage drop has been necessary.

More recently, U.S. Pat. application Ser. No. 667,791 has described a way of eliminating this need for annealing to relieve the trade-off involved in previous irradiation processes by irradiation with nuclear sources and preferably proton and alpha particle sources. However, this technique did not lend itself to mass production of semiconductor devices because of the limited availability of particle sources. Also, the devices still had to be oriented relative to the radiation source before irradiation. Commercial electron irradiation remained the best available technique for altering the switching time because it was more readily adapted to large scale production of devices.

The use of irradiation with neutrons has been generally suggested to applicants, but when tried the devices were found unacceptable. Semiconductor devices of high power capability, where irradiation has been useful, have usually been specified to maintain stable electrical characteristics at operating and storage temperatures of 200° C. or more. The electrical characteristics of such devices irradiated with neutron radiation were found to be very sensitive to temperature changes and degrade at operating temperatures between 100° and 200° C.

The present invention overcame this difficulty. It provides a method of producing by simple irradiation semiconductor devices with superior electrical characteristics to those obtained by proton and alpha irradiation, yet with mass production capability comparable or greater than with electron irradiation. Additionally, it reduces time and expense in fabrication by electron irradiation because the devices need not be generally oriented on a flat surface preparatory to irradiation and can be fully encapsulated before they are irradiated.

A related problem for circuit designers in the application of thyristors and diodes is matching the recovery charge ($Q_{rr}$) of the devices. For example, where diodes and thyristors must be used in series or in parallel to provide the desired high voltage or high current characteristics for the circuit, one of the most important parameters is the recovery charge of the individual devices. The recovery charge of each diode or thyristor must be matched with the other diodes or thyristors in the circuit so that each device supports substantially the same amounts of voltage or current within the specified limits. Otherwise, an individual device of the circuit having too high a recovery charge will support too much of the voltage or current and be burned out, causing the entire circuit to fail.

It has been demonstrated to match the recovery charge of diodes and thyristors by irradiating with electron radiation with specific radiation dosages. This technique is described and claimed in application Ser. No. 687,278, filed May 17, 1976 and assigned to the same assignee as this application. However, as in techniques using electron irradiation, a trade-off with other electrical characteristics and most notably forward voltage drop was involved, which limited applications of the technique. Further the devices still had to be generally oriented relative to the radiation source before irradiation. The present invention also overcame this difficulty.

SUMMARY OF THE INVENTION

The present invention provides a method of reducing the switching time and recovery charge of certain semiconductor devices and particularly high speed, power semiconductor devices, most notably thyristors and diodes. The present invention reduces the switching time without significantly increasing the forward voltage drop and without significantly increasing the leakage current.

The device or group of devices to be processed are disposed to be exposed to a neutron radiation source of greater than 1.0 Mev. The device or group of devices is then irradiated with the neutron radiation source to a dosage between $1\times10^{11}$ and $1\times10^{15}$ neutrons per square centimeter and preferably between $1\times10^{11}$ and $1\times10^{14}$ neutrons per square centimeter. More desirably, the irradiation is performed with a radiation source having substantial energy greater than 14 Mev.

The devices are also annealed during the irradiation or after the irradiation is completed, or both. The neutron irradiated devices are temperature sensitive at 100° to 150° C., and the annealing is performed at such temperatures where these temperatures are higher than the highest specified operating or storage temperature. The annealing is preferably performed at a temperature at least 50° C. greater than the highest specified temperature. Preferably the annealing is done during the irradiation. When annealing occurs after irradiation, it is desirable to extend the radiation dosage beyond the dosage associated with production of the desired electrical characteristics so that the subsequent anneal causes the electrical characteristics of the device to return to the desired value. The electrical characteristics are, however, less accurately controlled when annealed after irradiation. Also, annealing after irradiation extends the processing time which is very undesirable.

Other details, objects and advantages of the invention will become apparent as the following description of the present preferred embodiments and present preferred methods of practicing the same proceeds.

BRIEF DESCRIPTION OF THE DRAWINGS

In the accompanying drawings, the preferred embodiments of the invention and the preferred methods of practicing the invention are illustrated in which.

DESCRIPTION OF THE PREFERRED EMBODIMENTS

Figure 1:
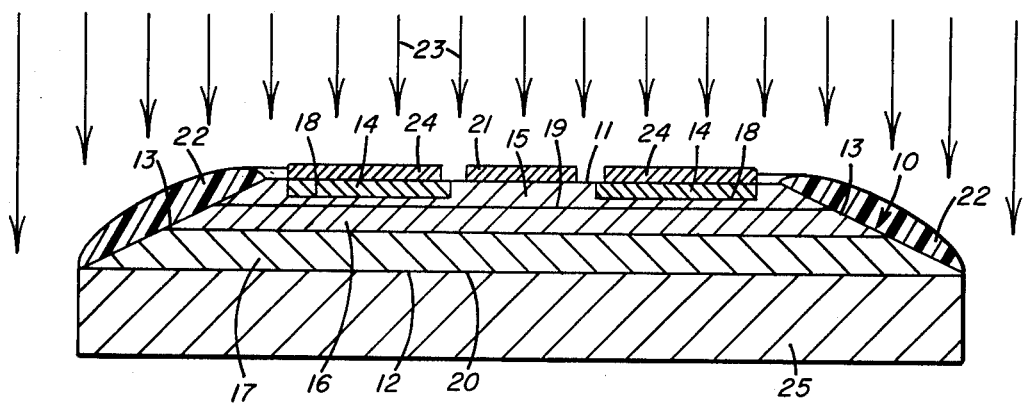
FIG. 1 is an elevational view in cross-section of a center fired thyristor being irradiated in accordance with the present invention.

Referring to FIG. 1, a center fired silicon thyristor wafer or body 10 is shown having opposed major surfaces 11 and 12 and curvilinear side surfaces 13. The thyristor wafer 10 has cathode-emitter region 14 and anode-emitter region 17 of impurities of opposite conductivity type adjoining major surfaces 11 and 12, respectively, and cathode-base region 15 and anode-base region 16 of impurities of opposite conductivity type in the interior of the wafer 10 between emitter regions 14 and 17. Cathode emitter region 14 and cathode-base region 15 are also of opposite conductivity type of impurities as is anode-base region 16 and anode-emitter region 17. By this arrangement, thyristor wafer 10 is provided with a four layer impurity structure in which three PN junctions 18, 19 and 20 are provided between adjoining regions.

The thyristor is provided with a center fired gate by adjoining cathode-base region 15 to the major surface 11 at center portions thereof. Cathode-emitter region 14 thus extends around surface portions of region 15. To provide electrical connection to the thyristor wafer, metal contacts 21 and 24 make ohmic contact to cathode-base region 15 and cathode-emitter region 14, respectively, at major surface 11; and metal substrate 25 makes ohmic contact to anode-emitter region 17 at major surface 12. Atmospheric effects on the thyristor operation are substantially reduced by coating side surfaces 13 with a suitable passivating resin 22 such as silicone or epoxy composition.

The thyristor is positioned for exposure to a neutron source of greater than 1.0 Mev. and preferably having substantial energy greater than 14 Mev. Although the thyristor is shown with surface 11 facing the neutron source, it is not necessary that this be the direction of exposure to the radiation source. The thyristor is then irradiated with neutron radiation 23 to a dosage between $1 \times 10^{11}$ and $1 \times 10^{15}$ neutrons per square centimeter and preferably between $1 \times 10^{11}$ and $1 \times 10^{14}$ neutrons per square centimeter. The switching time and recovery charge of the thyristor is thus reduced to a desired value, the precise dosage varying with the specifically desired electrical characteristics.

Figure 3:
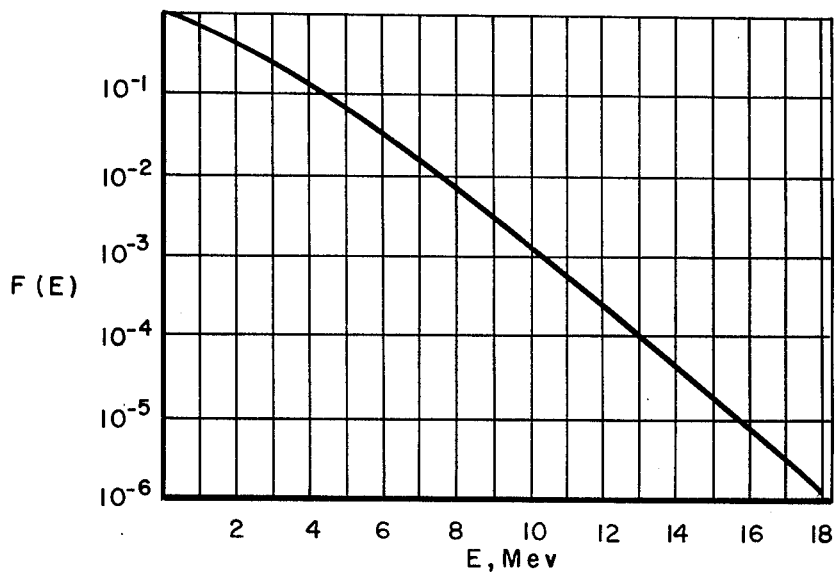
FIG. 3 is a graph showing the fraction of neutrons emitted with energies greater than E from a thermal fission of uranium 235.

The irradiation may be performed with any suitable radiation source of energy greater than 1.0 Mev. Less energies are not suitable because they do not produce sufficient lattice damage in the device to reduce the switching time within a practical time period. The most commercially usable neutron radiation sources are DT generators and nuclear fission reactors. Nuclear reactors are known to produce neutrons of energy over a spectrum up to and above 18 Mev., with the average between 1 and 2 Mev. as shown in FIG. 3. With water reactors, the energy of neutron sources can be selected to some extent by positioning the devices to be irradiated a selected distance from the reactor core.

Deuterium-Tritium (DT) generators are, however, preferred in some circumstances for the radiation sources because they produce a mono-energetic radiation with particles of substantial energies above 14 Mev., and more precisely, around 14.3 Mev. The radiation hazard is substantially reduced with a DT generator, and DT generators are not as bulky as fission reactors. DT generators also produce isotropic energy beams which are advantageous in certain situations to precisely control the electrical characteristics; however, isotropic energy beams require that the distance between the source and the device be controlled with greater precision, and that a group of devices be placed along a hemisphere. DT generators presently available can produce only about $10^{11}$ neutrons per second which substantially restricts the use of DT generators as neutron sources for the invention at present.

Fission reactor sources that are preferred are $U^{235}$ and $Pu^{239}$. $Cf^{252}$ may also be used as a fission source, although it is not a reactor source.

The precise dosage within the limits of $1 \times 10^{11}$ and $1 \times 10^{15}$ neutrons per square centimeter and preferably $1 \times 10^{11}$ and $1 \times 10^{14}$ neutrons per square centimeter will depend on the composition and geometry of the device and the beginning electrical characteristics and the desired electrical characteristics of the device. Experimentation with a few thyristors of the type to be processed to different dosages is readily done to determine the optimum dosage for the particular type of device. If annealing is done after irradiation, the actual dosage may be greater than the stated dosage so that the equivalent dosage after annealing is within the stated limits.

After or during irradiation, the thyristor is annealed by heating to higher than the specified operating and storage (whichever is higher) temperature and preferably at least 50° C. higher than the specified operating and storage temperature. The annealing temperature is at least 100° C. and preferably at least 150° C. Preferably the annealing is done at about 200° to 250° C. to provide annealing at a temperature above the specified temperature and to provide annealing as desired with a commercially appropriate period of time. Since the thyristor can be and preferably is packaged before irradiation and annealing is performed, few precautions need to be taken to ensure that the annealing is performed in an inert atmosphere.

Figure 2:
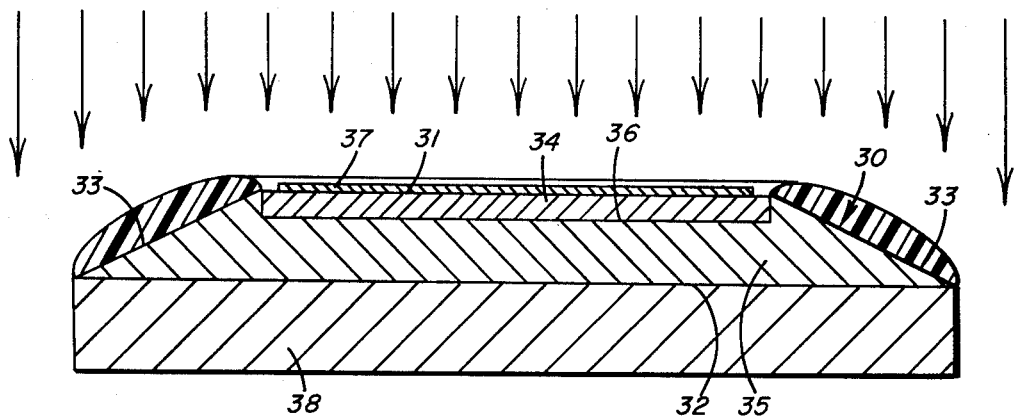
FIG. 2 is an elevational view in cross-section of a diode being irradiated in accordance with the present invention.

Referring to FIG. 2, a power diode wafer or body 30 is shown having opposed major surfaces 31 and 32 and curvilinear side surfaces 33. The diode wafer 30 has cathode-base region 34 and anode-base region 35 of impurities of opposite conductivity type adjoining major surfaces 31 and 32 respectively and adjoining each other to form PN junction 36.

The diode has metal contact 37 making ohmic contact to cathode-base region 34 at major surface 31, and metal substrate 38 making ohmic contact to anode-base region 35 at major surface 32. Atmospheric effects on the diode operation are substantially reduced by coating side surfaces 33 with a suitable passivating resin 39 such as silicone or epoxy composition.

The diode is positioned for exposure to a neutron source of greater than 1.0 Mev. and preferably having substantial energy greater than 14 Mev. The diode is then irradiated with neutron radiation 40 for the neutron source to a dosage between $1 \times 10^{11}$ and $1 \times 10^{15}$ neutrons per square centimeter.

FIG. 3 shows the energy distribution of a typical fission neutron radiation source. Again, the diode is annealed during and/or after the irradiation at a temperature higher than the higher of the specified operating and storage temperature and preferably at least 50° C. higher than the highest specified temperature.

Figure 4:
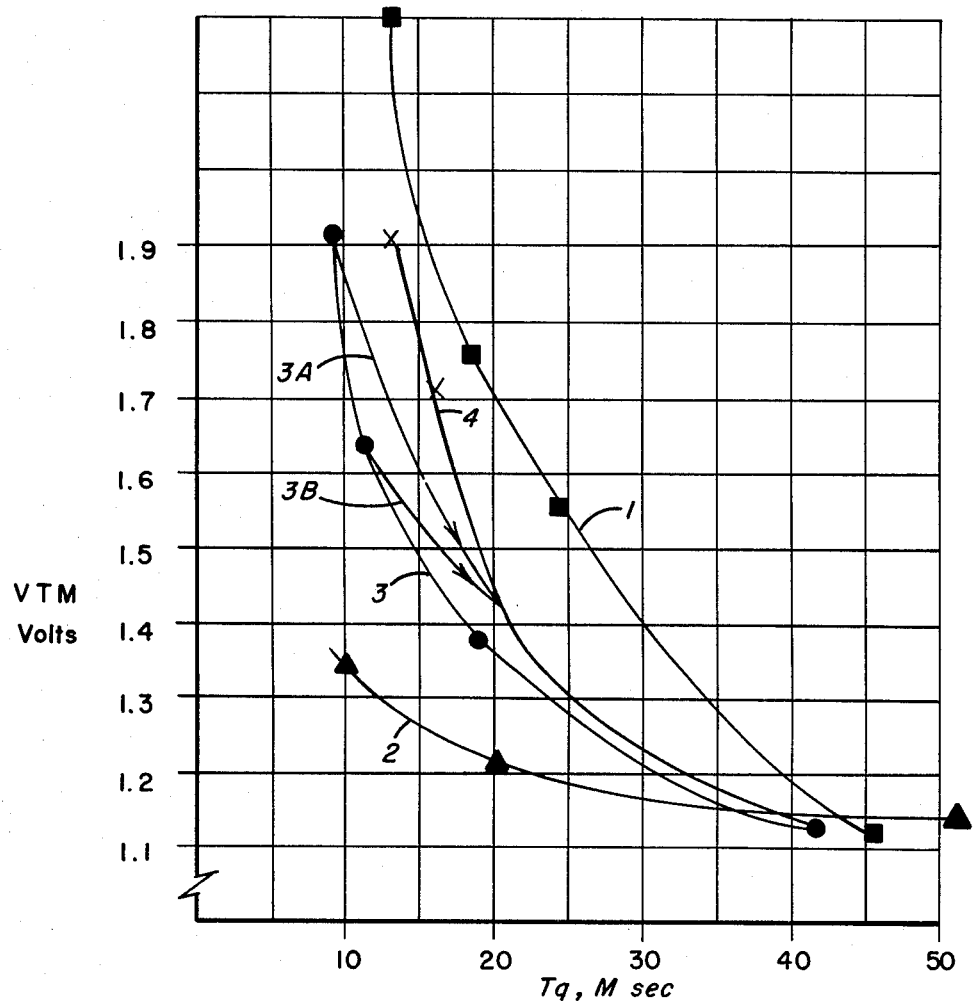
FIG. 4 is a graph showing the relationship between switching time and forward voltage drop on T72NCB type thyristors irradiated with alpha, electron and neutron radiation sources to various dosages and, in some incidences, annealed.

Referring to FIG. 4, the merits of the present invention compared to previously done radiation techniques is shown. A series of T78NCB thyristors were divided into five groups and irradiated as follows: the first group was irradiated with 2 Mev. electron radiation; the second group was irradiated with 10.2 Mev. alpha particles; the third group was irradiated with fission neutrons and subsequently annealed; and a fourth group was irradiated with fission neutrons and simultaneously annealed. The switching time and forward voltage drop of the thyristors were measured at stages as the irradiation dosage was increased, and after annealing occurred.

FIG. 4 shows that the 10.2 Mev. alpha irradiation provided the best electrical characteristics. The neutron irradiation provided substantially improved results over 2 Mev. electron irradiation.

The devices which were "hot" irradiated, specifically heated to 250° C. approximately ten minutes prior to the irradiation and kept at that temperature during the irradiation and for about fifteen minutes to one hour after irradiation was completed, provided the best stable characteristics for the neutron irradiated devices. As shown by FIG. 4, the devices which were neutron irradiated and subsequently annealed for thirty hours at 200° C. provided substantially improved results over the 2 Mev. electron irradiations, but did not provide as good electrical characteristics as the group which were "hot" irradiated, i.e., annealed while the irradiation proceeded.

Figure 5:
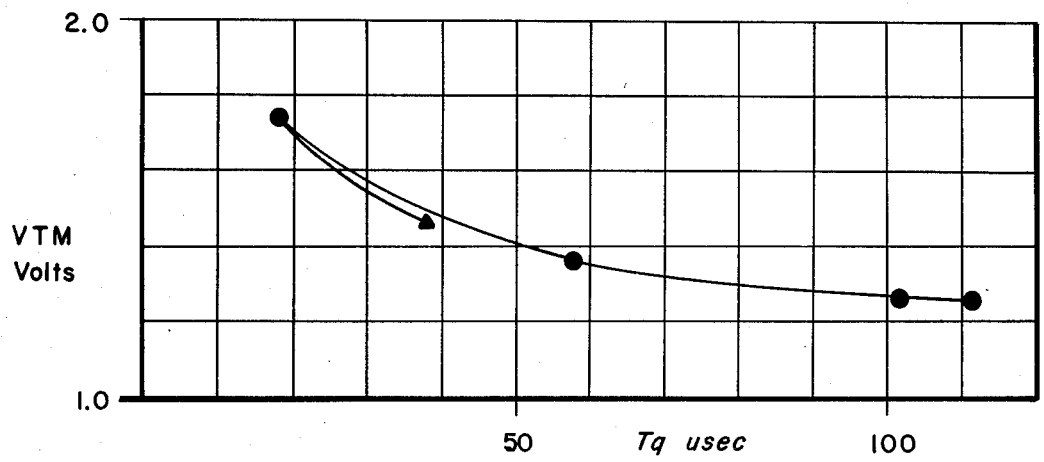
FIG. 5 is a graph showing the relationship between switching time and forward voltage drop on T62NBH type thyristors irradiated with a 14 Mev. neutron radiation source and subsequently annealed.

Referring to FIG. 5, a group of T62NBH thyristors were irradiated with fission neutrons to $5.1 \times 10^{11}$ neutrons per square centimeter; and subsequently annealed at 200° C. for 32 hours. The forward voltage drop and switching time were recorded at dosages of $4.6 \times 10^9$, $7.7 \times 10^{10}$ and $5.1 \times 10^{11}$ neutrons per centimeter square and after annealing the forward voltage drop was then plotted against switching time as shown in FIG. 5.

FIG. 5 shows that the irradiation with neutron radiation and subsequent annealing improved the switching time markedly without corresponding increases in forward voltage drop.

Figure 6:
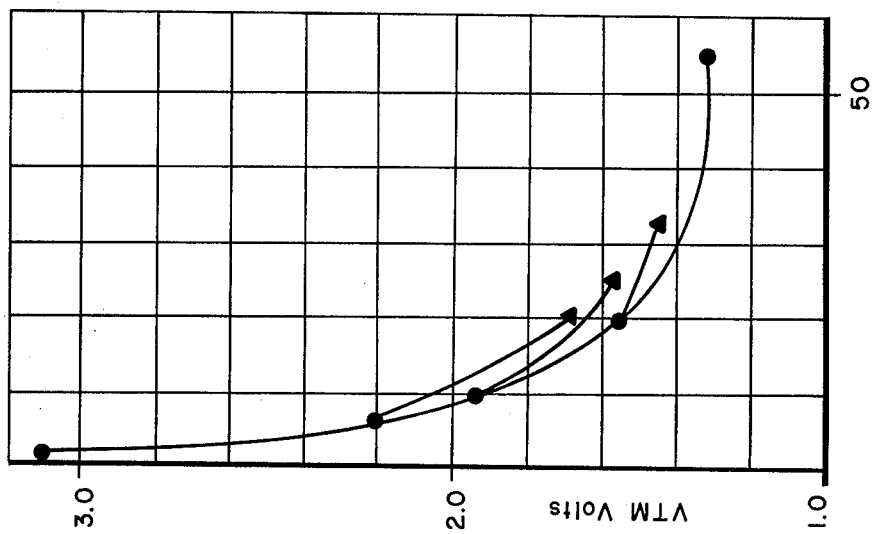
FIG. 6 is a graph showing the relationship between switching time and forward voltage drop on T62NBH type thyristors irradiated with fission neutron radiation sources to various dosages, and subsequently annealed.

Referring to FIG. 6, six groups of T62NBH thyristors were irradiated with fission neutron radiation to dosages of $6 \times 10^{11}$, $8 \times 10^{11}$, $1 \times 10^{12}$, $2.8 \times 10^{12}$, $3.6 \times 10^{12}$ and $6 \times 10^{12}$ neutrons per square centimeter. The groups irradiated to $3.6 \times 10^{12}$ (curve 1), $2.8 \times 10^{12}$ and $8 \times 10^{11}$ (curve 3) neutrons per square centimeter were subsequently annealed at 200° C. for 72 hours. The switching time and forward voltage drop were measured after irradiation and after annealing, and the results plotted in FIG. 6.

FIG. 6 shows that neutron irradiation followed by annealing substantially improved the switching time of the thyristors without significantly increasing the forward voltage drop.

Figure 7:
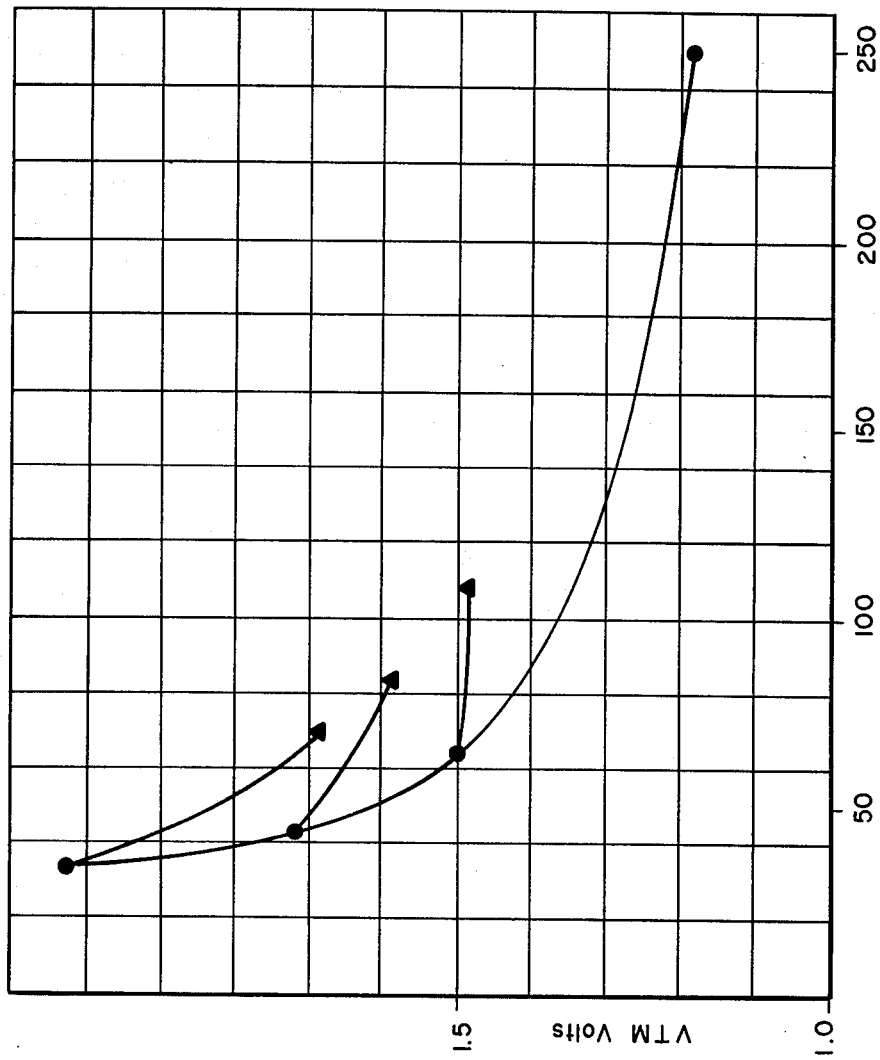
FIG. 7 is a graph showing the relationship between switching time and forward voltage drop on T98J type thyristors irradiated with fission neutron irradiation to various dosages and subsequently annealed.

Referring to FIG. 7, these groups of T98J thyristors were irradiated with fission neutrons to $5 \times 10^{11}$, $1 \times 10^{12}$ and $1.5 \times 10^{12}$ neutrons per centimeter square, and were subsequently annealed at 200° C. for 32 hours. The switching time and forward voltage drop of the thyristors were measured after irradiation and annealing. The results were plotted in FIG. 7.

FIG. 7 shows that neutron irradiation followed by annealing substantially lowered the switching time of the thyristors without significantly increasing the forward voltage drop.

Figure 8:
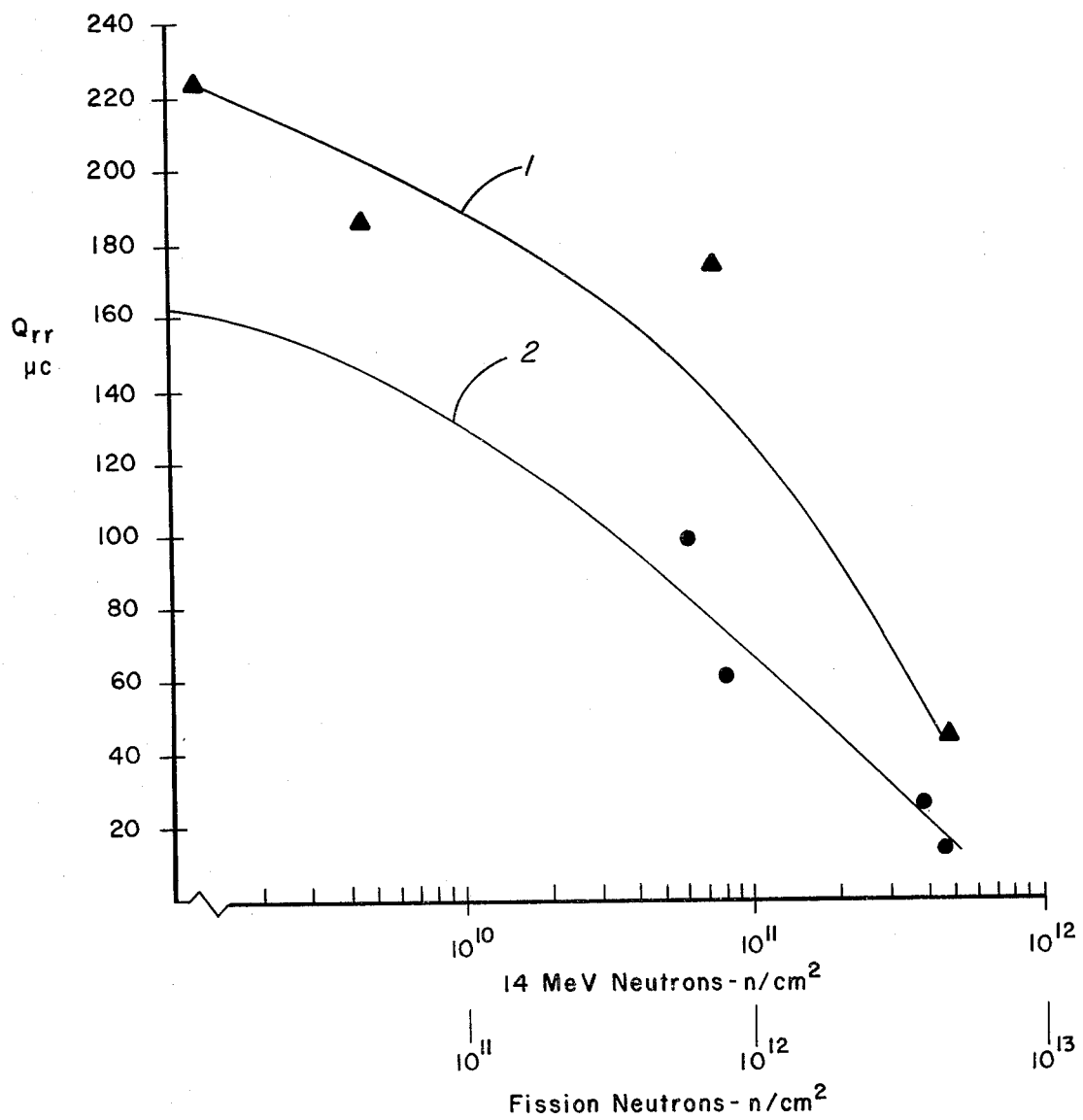
FIG. 8 is a graph showing the reduction of recovery charge of T62NBH type thyristors irradiated with fission and 14 Mev. neutron irradiation.

Referring to FIG. 8, two groups of T62NBH thyristors were irradiated with 14 Mev. neutron radiation and fission neutron radiation. The recovery charge of the thyristors was measured as the irradiation dosage accumulated and the results plotted in FIG. 8.

FIG. 8 shows that the neutron irradiation substantially improved the recovery charge of the thyristors, and that the fission neutron radiation provided lower recovery charge because of the high dosage which could be accumulated in a given time.

These results could then be stabilized for commercial use of the thyristor, with improved electrical characteristics, by annealing as above described.

Figure 9:
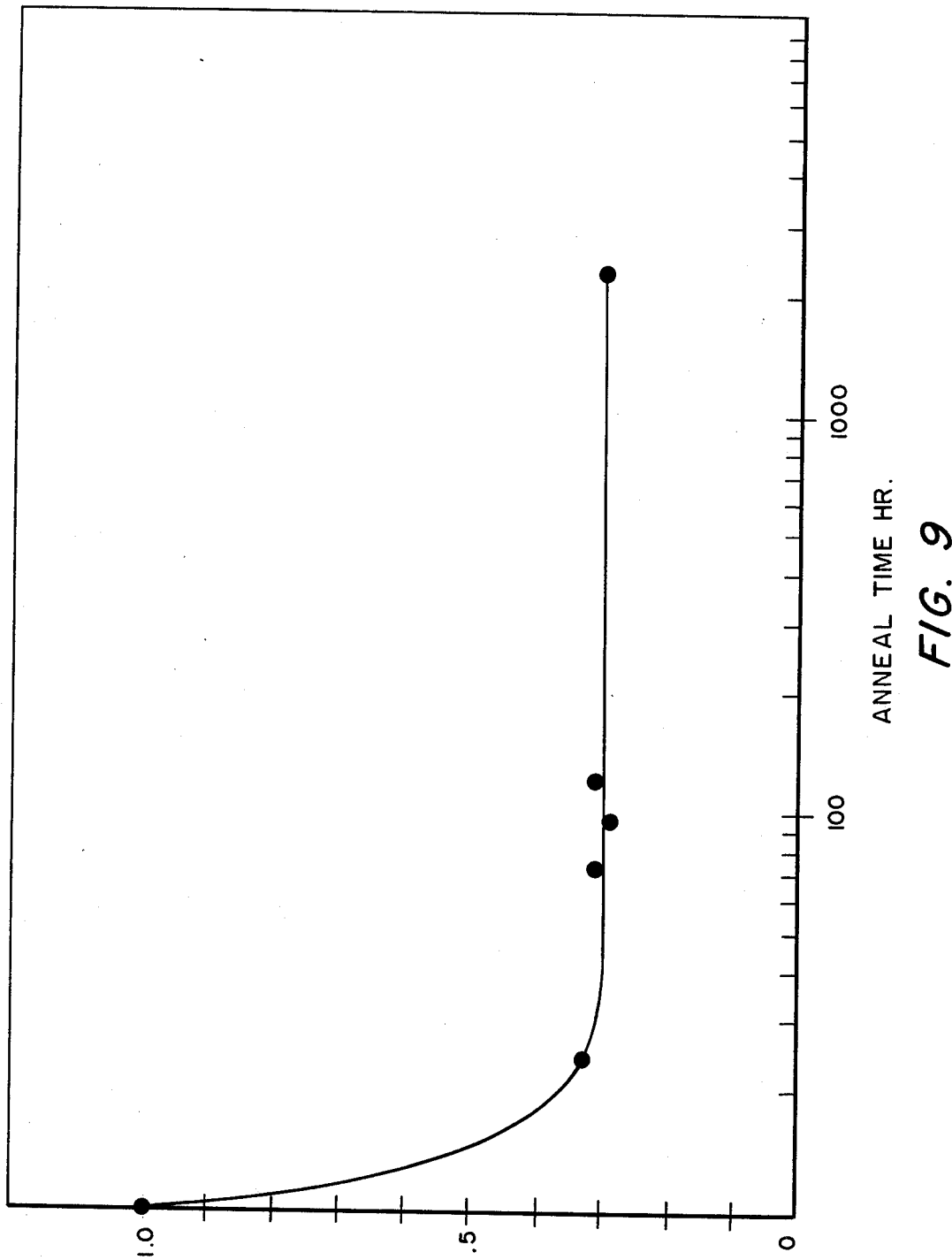
FIG. 9 is a graph showing the retention of the percentage of switching time by thyristors with prolonged annealing.

Referring to FIG. 9, to understand the retention of the electrical characteristics provided by the neutron irradiation, a group of T62NBH thyristors, previously neutron irradiated were annealed to 200° C. for a prolonged period of 2,000 hours. The switching time of the devices was measured after neutron irradiation and before annealing, and then as the annealing proceeded.

The ratio of the switching time before annealing to switching time recorded during the anneal was plotted against hours of annealing as shown in FIG. 9.

FIG. 9 makes clear that the devices become essentially stable in switching time characteristic after a relatively short annealing time. This experiment verified the stability of the invention for commercial use.

While presently preferred embodiments have been shown and described, it is distinctly understood that the invention may be otherwise variously performed and embodied within the scope of the following claims.

What is claimed is:

1. A method of changing the switching time and recovery charge of certain semiconductor devices comprising the steps of:
    A. positioning a semiconductor device containing at least one PN junction to be exposed to a neutron radiation source of greater than 1.0 Mev.;
    B. thereafter irradiating the semiconductor device with the neutron radiation source of greater than 1.0 Mev. to a dosage between $1 \times 10^{11}$ and $1 \times 10^{15}$ neutrons per square centimeter;
    C. annealing the semiconductor device at a temperature at least as high as the highest specified temperature for storage and use.

2. A method of changing the switching time and recovery charge of certain semiconductor devices as set forth in claim 1 wherein:
    the irradiation step is taken to a dosage between $1 \times 10^{11}$ and $1 \times 10^{14}$ neutrons per square centimeter.

3. A method of changing the switching time and recovery charge of certain semiconductor devices as set forth in claim 1 wherein:
    the annealing step is performed at a temperature at least 50° C. higher than the highest specified temperature for storage and use.

4. A method of changing the switching time and recovery charge of certain semiconductor devices as set forth in claim 1 wherein:
    substantial energy of the radiation source is greater than 14 Mev.

5. A method of changing the switching time and recovery charge of certain semiconductor devices as set forth in claim 1 wherein:
    the annealing step is performed at least in part during the irradiation step.

6. A method of changing the switching time and recovery charge of certain semiconductor devices as set forth in claim 1 wherein:
    the annealing step is performed after the irradiation step.

7. A method of changing the switching time and recovery charge of thyristors comprising the steps of:
    A. positioning a thyristor containing at least one PN junction to be exposed to a neutron radiation source of greater than 1.0 Mev.;
    B. thereafter irradiating the thyristor with the neutron radiation source of greater than 1.0 Mev. to a dosage between about $1 \times 10^{11}$ and $1 \times 10^{14}$ neutrons per square centimeter; and
    C. annealing the thyristor at a temperature at least as high as the highest specified temperature for storage and use.

8. A method of changing the switching time and recovery charge of thyristors as set forth in claim 7 wherein:
    the annealing step is performed at a temperature at least 50° C. higher than the highest specified temperature for storage and use.

9. A method of changing the switching time and recovery charge of thyristors as set forth in claim 8 wherein:
    the annealing step is performed at a temperature of at least about 200° C.

10. A method of changing the switching time and recovery charge of thyristors as set forth in claim 8 wherein:
    the annealing step is performed at least in part during the irradiation step.

11. A method of changing the switching time and recovery charge of thyristors as set forth in claim 8 wherein:
    the annealing step is performed after the irradiation step.

12. A method of changing the switching time and recovery charge of diodes comprising the steps of:
    A. positioning a diode containing at least one PN junction to be exposed to a neutron radiation source of greater than 1.0 Mev.;
    B. thereafter irradiating the diode with the neutron radiation source of greater than 1.0 Mev. to a dosage between about $1 \times 10^{11}$ and $1 \times 10^{15}$ neutrons per square centimeter; and
    C. annealing the diode at a temperature at least as high as the highest specified temperature for storage and use.

13. A method of changing the switching time and recovery charge of diodes as set forth in claim 12 wherein:
    the annealing step is performed at a temperature at least 50° C. higher than the highest specified temperature for storage and use.

14. A method of changing the switching time and recovery charge of diodes as set forth in claim 13 wherein:
    the annealing step is performed at a temperature of at least about 200° C.

15. A method of changing the switching time and recovery charge of diodes as set forth in claim 13 wherein:
    substantial energy of the radiation source is greater than 14 Mev.

16. A method of changing the switching time and recovery charge of diodes as set forth in claim 13 wherein:
    the annealing step is performed at least in part during the irradiation step.

17. A method of changing the switching time and recovery charge of diodes as set forth in claim 13 wherein:
    the annealing step is performed after the irradiation step.

* * * * *